(12) United States Patent
Chen

(10) Patent No.: US 6,808,411 B2
(45) Date of Patent: Oct. 26, 2004

(54) FAN HOLDER WITH ELECTRICAL CONNECTOR SOCKET

(75) Inventor: Li Ping Chen, Tu-Chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/678,529

(22) Filed: Oct. 3, 2003

(65) Prior Publication Data

US 2004/0115986 A1 Jun. 17, 2004

(30) Foreign Application Priority Data

Dec. 13, 2002 (TW) ..................................... 91220208 U

(51) Int. Cl.⁷ ............................................... H01R 13/00
(52) U.S. Cl. ........................ 439/485; 439/378; 439/246; 361/695
(58) Field of Search ................................ 439/247, 375, 439/485, 565, 954; 361/695

(56) References Cited

U.S. PATENT DOCUMENTS

| 5,622,511 | A | * | 4/1997 | Jarrett | 439/248 |
| 6,190,197 | B1 | * | 2/2001 | Polgar et al. | 439/527 |
| 6,435,889 | B1 | * | 8/2002 | Vinson et al. | 439/247 |
| 6,711,013 | B2 | * | 3/2004 | Wobig et al. | 361/687 |

* cited by examiner

Primary Examiner—Ross Gushi
Assistant Examiner—James Harvey
(74) Attorney, Agent, or Firm—Wei Te Chung

(57) ABSTRACT

A fan holder (30), for mounting a fan (10) having an electrical connector (16) to a computer chassis (50), includes a base (32) for mounting to a body (12) of the fan, a pair of arms (38) extending from opposite sides of the base for embracing the body of the fan, and a socket (44) integrally formed on one of the opposite sides of the base. Each of the arms forms a protrusion (41) for being slidingly received in a slot (41) of a corresponding latch (54) of the computer chassis. The socket defines a groove (46) for receiving a locating plate (20) of the connector thereby combining the connector to the fan holder. When the combined fan and fan holder is detached from the computer chassis, the connector is simultaneously drawn out from a corresponding receptacle (56) of the computer chassis.

5 Claims, 7 Drawing Sheets

FAN HOLDER WITH ELECTRICAL CONNECTOR SOCKET

BACKGROUND OF THE INVENTION

1. Field of the Invention

The present invention relates to a fan holder for mounting a fan to a computer chassis, and particularly to a fan holder which can readily and conveniently attach and detach an electrical connector of a fan to and from a corresponding electrical receptacle in a computer chassis.

2. Related Art

As computer technology continues to advance, central processing units and chipsets in computers continue to have faster operational speeds and greater functional capabilities. Heat produced within a computer enclosure increases greatly when these high-speed components are operating. It is desirable to dissipate the heat quickly, so that the components can operate within their normal temperature ranges. This assures the quality of data operation, storage and transfer. Dissipation can be attained, for example, by using a heat sink system installed within the computer enclosure.

A conventional heat sink assembly comprises a heat sink, and a fan assembly mounted on the heat sink for guiding heated air away from the heat sink. Taiwan Patent Application No. 88205165 discloses a fan assembly comprising a fan and a cover attached on the fan. The fan comprises a body, an electrical connector, and a plurality of leads connecting the connector and the body. After the fan is installed into a computer chassis, a plug of the connector is then inserted into a receptacle of a circuit board within the computer chassis. However, interference to the leads of the fan and other leads within the computer chassis may occur. Moreover, the plug is typically small and when the fan is attached to or detached from the computer chassis, the connector must be engaged into or disengaged from the receptacle by a separate operation, which is time-consuming and inconvenient.

SUMMARY OF THE INVENTION

Accordingly, an object of the present invention is to provide a fan holder which allows convenient insertion and removal of a connector of a fan into and from an electrical receptacle of a computer chassis.

To achieve the above-mentioned object, a fan holder in accordance with a preferred embodiment of the present invention comprises a base for mounting to a body of a fan; a pair of arms extending from opposite sides of the base for embracing the body of the fan, and a socket integrally extending from one of the opposite sides of the base. Each of the arms forms a protrusion for slidingly received in a slot of a latch of a computer. The socket defines a groove for receiving a locating plate of a connector of the fan thereby combining the connector to the fan holder. When the protrusions are slid out from the slots to detach the combined fan and fan holder from the computer chassis, the connector is simultaneously disengaged from a corresponding receptacle of the computer chassis.

In an alternative embodiment of the present invention, the fan holder comprises a base, an arm extending from one side of the base, a locking part extending from an opposite side of the base, and a socket extending from the opposite side of the base. The arm engages the body of the fan. The locking part forms a fastener for engaging in a locking opening of a latch of a computer chassis. When the fastener is released from the locking opening and the combined fan and fan holder is detached from the computer, the connector is simultaneously disengaged from a corresponding receptacle of the computer chassis.

Other objects, advantages and novel features of the present invention will be drawn from the following detailed description of preferred embodiments of the present invention with attached drawings, in which:

DETAILED DESCRIPTION OF THE INVENTION

Figure 1:
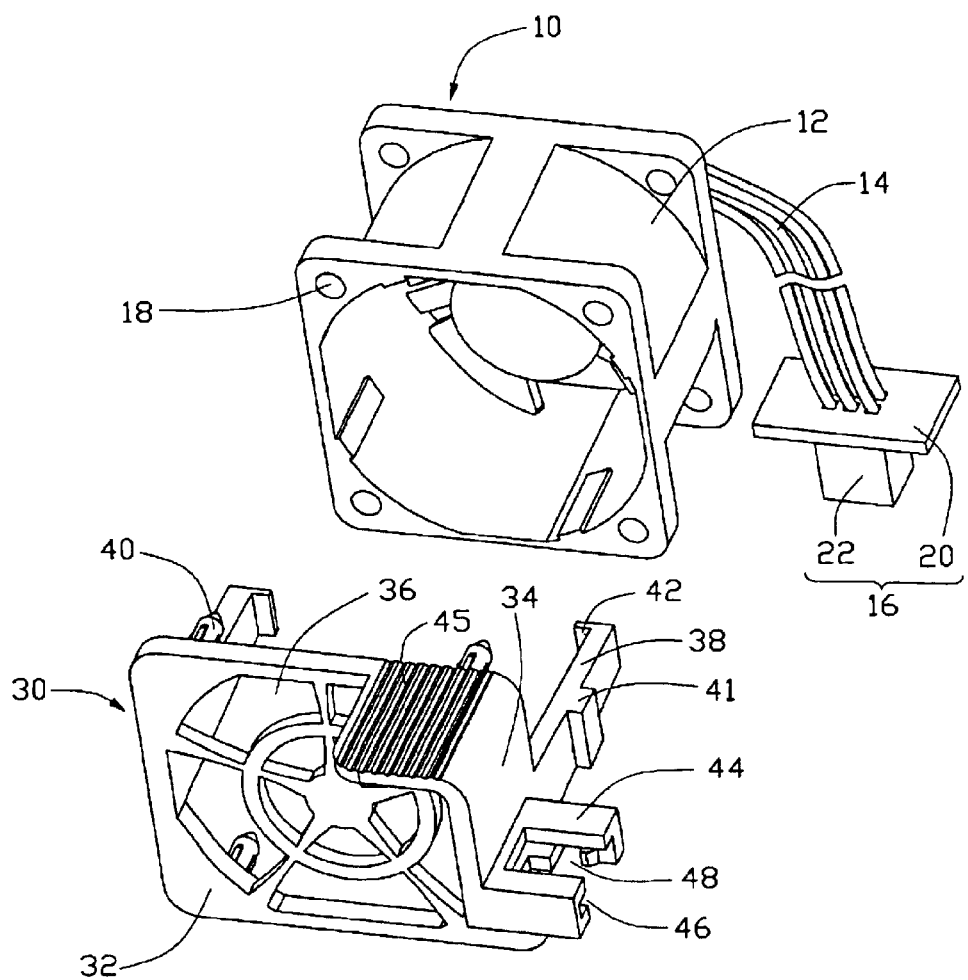
FIG. 1 is an exploded, isometric view of a fan holder in accordance with the preferred embodiment of the present invention together with a fan, the fan comprising a body, an electrical connector and a plurality of leads electrically connecting the body and the connector.

FIG. 1 shows a fan holder 30 in accordance with the preferred embodiment of the present invention. The fan holder 30 is for mounting a fan 10 to a computer chassis 50 (see FIG. 4). The fan 10 comprises a body 12, an electrical connector 16, and a plurality of leads 14 electrically connecting the body 12 and the connector 16. Four locking holes 18 are defined in four corners of a mating portion of the body 12 respectively. The connector 16 comprises a locating plate 20, a plug 22, and a locking portion 24 (see FIG. 2).

Figure 2:
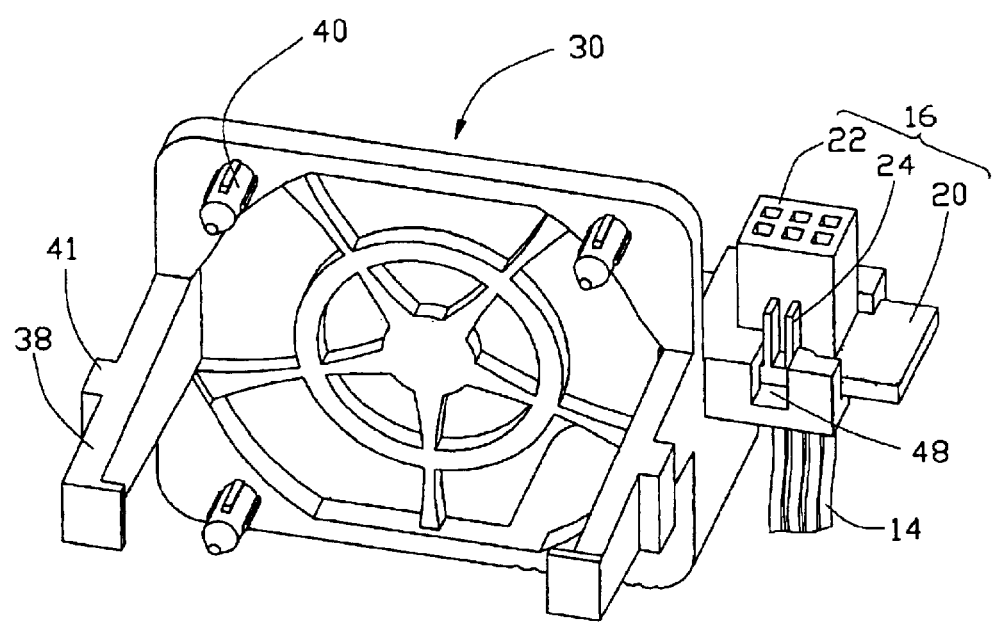
FIG. 2 is an assembled view of the fan holder and the connector of the fan of FIG. 1, but viewed from another aspect.

Referring also to FIG. 2, the fan holder 30 comprises a base 32, and an L-shaped side panel 34 extending perpendicularly in a first direction from two adjoining side edges of the base 32. A vent 36 is defined in the base 32. A pair of symmetric arms 38 extends in a second direction from opposite side edges of the base 32 respectively, the second direction being opposite to the first direction. One of the arms 38 is coplanar with a first part of the side panel 34. A protrusion 41 is formed on an outside of each arm 38. A finger 42 is formed on an inside of a free end of each arm 38. Four posts 40 extend in the second direction from the base 32, for engaging in the locking holes 18 of the fan 10 respectively. A U-shaped socket 44 is formed on an outside of said first part of the side panel 34, for holding the connector 16 therein. A groove 46 is defined in the socket 44, for receiving the locating plate 20 of the connector 16 therein. A channel 48 is defined in a side of the socket 44 in communication with the groove 46, for receiving the locating portion 24 of the connector 16 therein. A plurality of parallel ridges is formed on an outside of a second part of the side panel 34, said second part being perpendicular to said first part. The ridges thereby define an operation portion 45.

Figure 3:
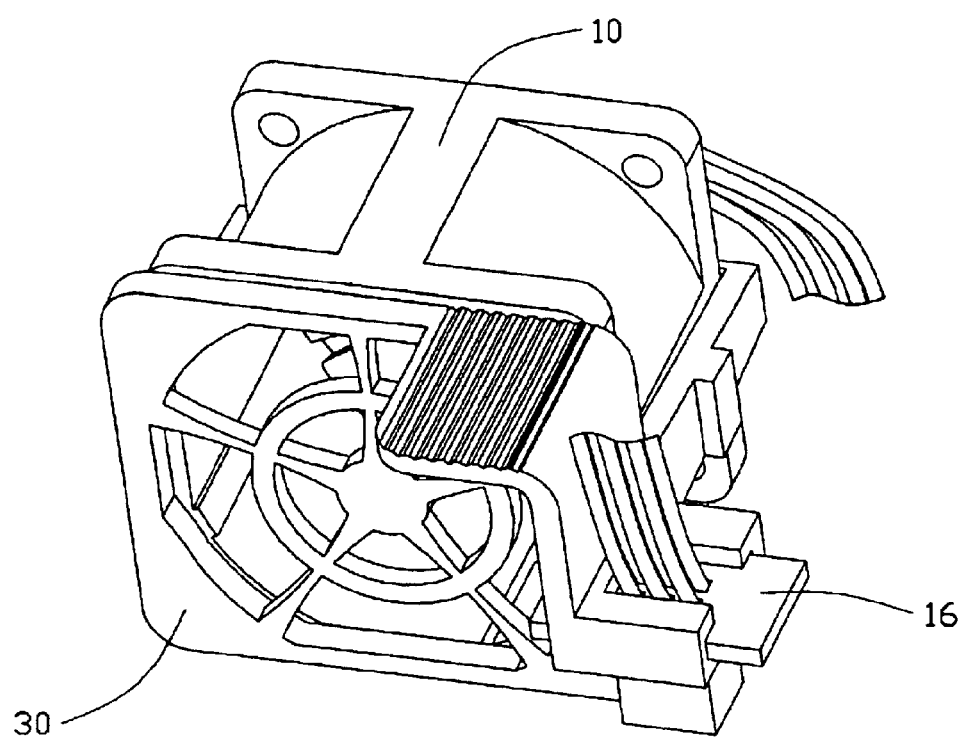
FIG. 3 is an assembled view of FIG. 1.

Referring also to FIG. 3, in pre-assembly, the fan holder 30 is attached to the fan 10. The posts 40 of the fan holder 30 are engagingly received in the locking holes 18 of the fan 10. The arms 38 embrace the body 12 of the fan 10, with the body 12 being sandwiched between the base 32 and the fingers 42. The locating plate 20 is received in the groove 46. The plug 22 protrudes out beyond the socket 44. The locking portion 24 is deformably received in the channel 48. The connector 16 is thus securely held in the socket 44.

Figure 4:
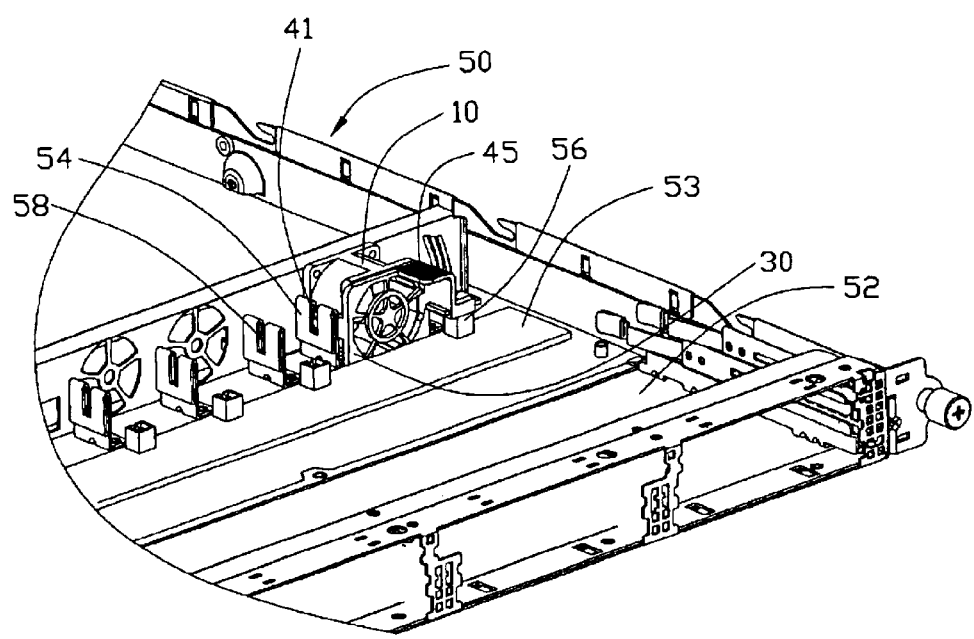
FIG. 4 is an isometric view of part of a computer chassis in which the combined fan and fan holder of FIG. 3 is mounted.

FIG. 4 shows part of a computer chassis 50 in which the combined fan 10 and fan holder 30 is mounted. The computer chassis 50 comprises a bottom plate 52. A row of latches 54 is provided on the bottom plate 52. Each latch 54 defines a vertical slot 58, for receiving a corresponding protrusion 41 of the fan holder 30. A circuit board 53 is mounted on the bottom plate 52. A row of electrical receptacles 56 is installed on the circuit board 53, the row of receptacles 56 being parallel to the row of latches 54.

In assembly, the combined fan 10 and fan holder 30 is held above the bottom plate 52 of the computer chassis 50, with the protrusions 41 of the fan holder 30 aligned with the slots 58 of a pair of selected latches 54. The combined fan 10 and fan holder 30 is then pressed downwardly between the latches 54 until the protrusions 41 reach bottom ends of the slots 58. The plug 22 is thus simultaneously inserted into and engaged with a corresponding receptacle 56. The fan 10 is thus mounted in the computer chassis 50 by means of the fan holder 30.

In disassembly, the operation portion 45 is pulled upwardly, and the protrusions 41 are drawn up and out from the slots 41 of the latches 54. The plug 22 is thereby simultaneously disengaged from the receptacle 56. The combined fan 10 and fan holder 30 is thus easily detached from the computer chassis 50.

Figure 5:
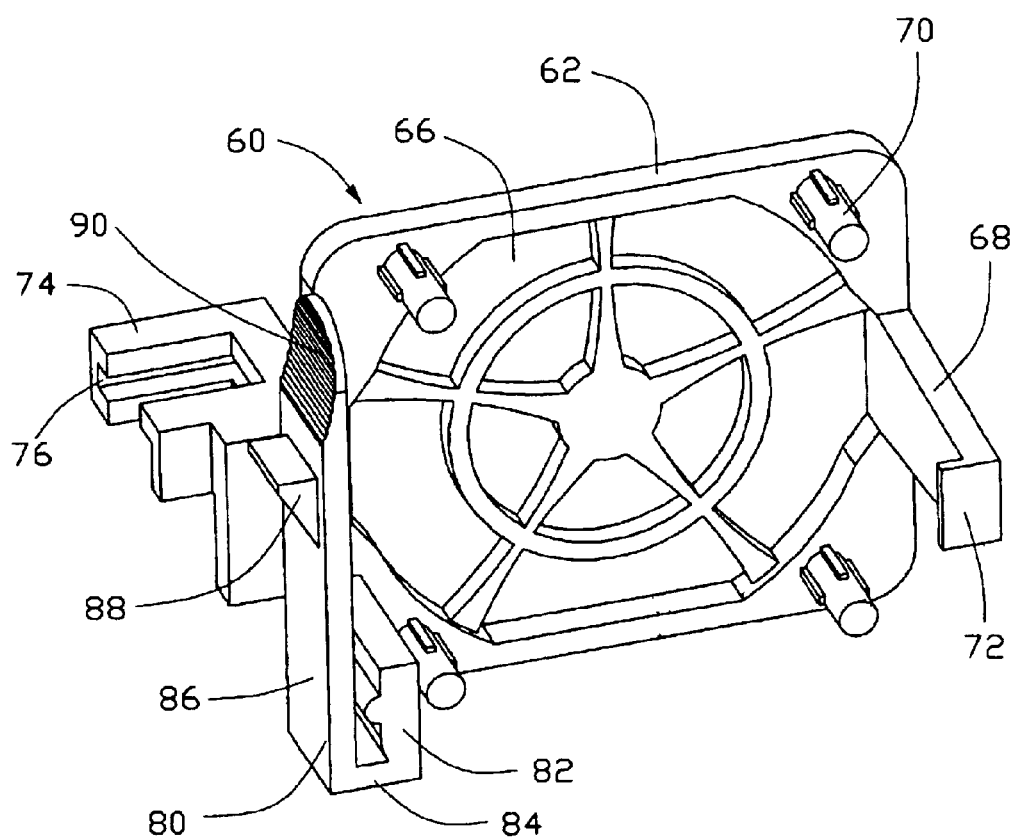
FIG. 5 is an isometric view of a fan holder in accordance with the alternative embodiment of the present invention.
Figure 6:
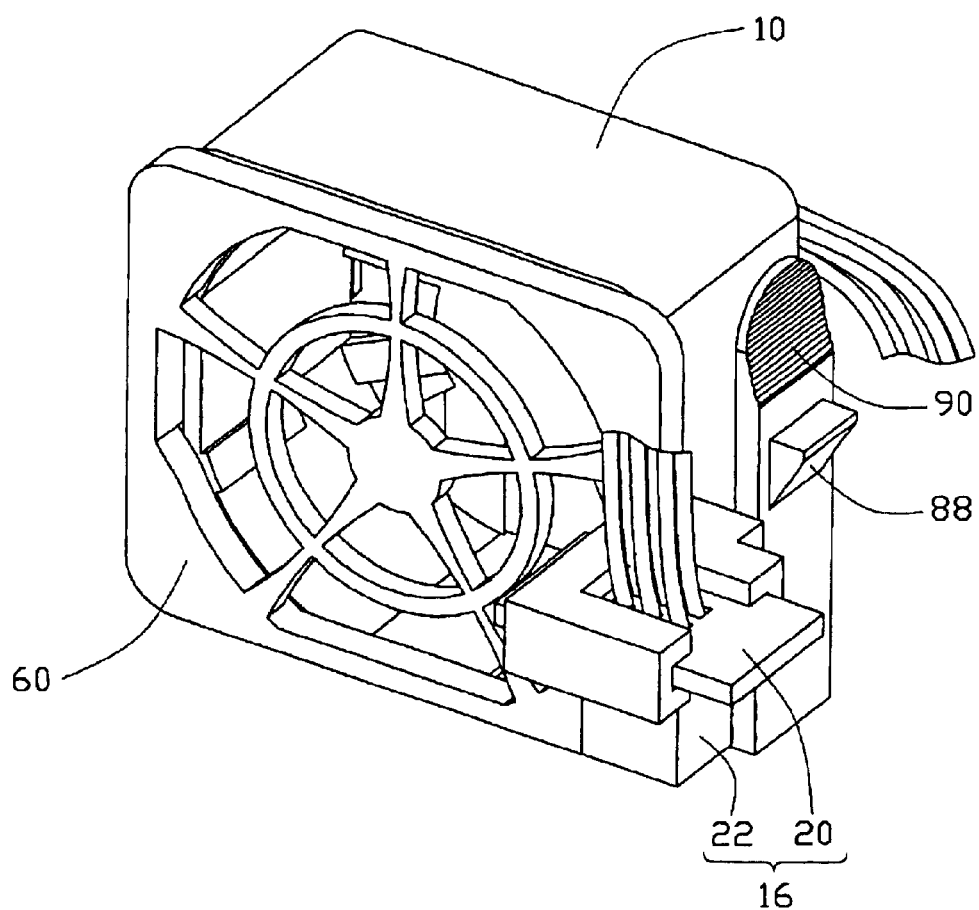
FIG. 6 is an assembled, isometric view of the fan holder of FIG. 5 and the fan of FIG. 1.

FIG. 5 shows a fan holder 60 in accordance with the alternative embodiment of the present invention. The fan holder 60 comprises a base 62, and a locking part 80 adjoining a first side of the base 62. A vent 66 is defined in the base 62. An arm 68 extends perpendicularly in a first direction from a second side of the base 62, the second side being opposite from the first side. A finger 72 is formed on an inside of a free end of the arm 68. Four posts 70 extend in the first direction from four corners of the base 62 respectively. The locking part 80 comprises an extension portion 82 extending in the first direction from the first side of the base 62, a connecting portion 84 extending perpendicularly from a distal end of the extension portion 82, and an elastic locking portion 86 extending perpendicularly from a distal end of the connecting portion 84. The extension portion 82, connecting portion 84 and locking portion 86 are all perpendicular to the base 62. A plurality of parallel ridges is formed on a free end of the locking portion 86, thereby defining an operation portion 90. A fastener 88 is formed on the locking portion 86, adjacent the operation portion 90. A socket 74 extends from the first side of the base 62 in a second direction, the second direction being opposite to the first direction. The socket 74 defines a groove 76, for receiving the locating plate 20 of the connector 16 (see FIG. 6). The fan holder 60 is attached to the fan 10 in much the same way as described above in relation to the fan holder 30 of the preferred embodiment.

Figure 7:
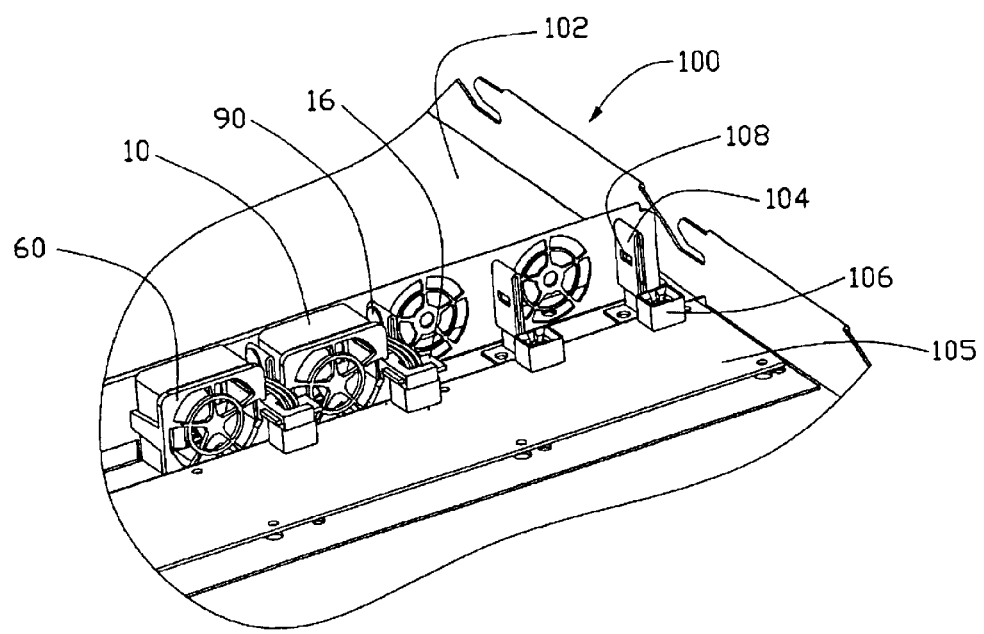
FIG. 7 is an isometric view of part of a computer chassis in which the combined fan and fan holder of FIG. 6 is mounted.

FIG. 7 shows part of a computer chassis 100 in which the combined fan 10 and fan holder 60 is mounted. The computer chassis 100 comprises a bottom plate 102. A row of latches 104 is provided on the bottom plate 102. Each latch 104 defines a locking opening 108, for engaging with the fastener 88. A circuit board 105 is mounted on the bottom plate 102. A row of electrical receptacles 106 is installed on the circuit board 105, the row of receptacles 106 being parallel to the row of latches 104. In assembly, the combined fan 10 and fan holder 60 is held above the bottom plate 102 of the computer chassis 100 between a pair of selected latches 104. The combined fan 10 and fan holder 60 is then pressed downwardly until the fastener 88 is snappingly received in the locking opening 108 of a corresponding latch 104. The plug 22 of the connector 16 is thus simultaneously inserted into and engaged with a corresponding receptacle 106. The fan 10 is thus mounted in the computer chassis 100 by means of the fan holder 60.

In disassembly, the operation portion 90 is pressed toward the fan holder 60, in order to release the fastener 88 from the locking opening 108. The combined fan 10 and fan holder 60 is then drawn up and out from between the latches 104 of the computer chassis 100. The plug 22 is thereby simultaneously disengaged from the receptacle 106. The combined fan 10 and fan holder 60 is thus easily detached from the computer chassis 100.

In the present invention, the connector 16 is combined with either fan holder 30, 60. In assembly, there is no need for an extra separate operation in order to engage the connector 16 with the receptacle 56, 106 of the computer chassis 50, 100. The connector 16 is conveniently engaged with the receptacle 56, 106. In addition, because the connector 16 does not have to be separately manipulated by an operator's fingers, interference to the leads 14 and other leads within the computer chassis 50, 100 does not occur. In disassembly, when the combined fan 10 and fan holder 30, 60 is drawn up and out from the latches 54, 104, the connector 16 is simultaneously disengaged from the receptacle 56, 106. There is no need for an extra separate operation in order to disengage the connector 16 from the receptacle 56, 106. The connector 16 is conveniently disengaged from the receptacle 56, 106. Furthermore, because the connector 16 does not have to be separately manipulated by an operator's fingers, interference to the leads 14 and the other leads within the computer chassis 50, 100 does not occur.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A fan holder for mounting a fan to a computer chassis, the fan comprising a body, a connector and a plurality of leads electrically connecting the body and the connector, the fan holder comprising:

a base for mounting to the body of the fan;

an arm extending from one side of the base in a first direction for engaging the body of the fan; and a socket integrally formed with the base for retaining the connector of the fan therein;

wherein a plurality of posts extends from the base in the first direction, for engaging in the body of the fan;

wherein the socket defines a groove, for retaining a locating plate of the connector therein;

wherein the socket further defines a channel in communication with the groove, for receiving a locking portion of the connector;

wherein a side panel extends from the base in a second direction opposite to the first direction;

wherein the side panel is L-shaped and comprises a first part and a second part, the socket integrally extends from the first part, and a plurality of ridges is formed on the second part for facilitating operation.

2. The fan holder as claimed in claim 1, further comprising another arm extending from an opposite side of the base, and wherein each of the arms forms a protrusion for engaging with the computer chassis.

3. The fan holder as claimed in claim 1, further comprising a locking part extending from an opposite side of the base, the locking part forming a fastener for engaging with the computer chassis.

4. The fan holder as claimed in claim 3, wherein the locking part comprises an operation portion at a free end thereof, for facilitating disengaging of the fastener from the computer chassis.

5. A fan holder assembly comprising:
- a computer chassis comprising a bottom plate and a circuit board mounted on the bottom plate, the circuit board providing a receptacle;
- a fan comprising a body and a connector, the connector comprising a plug inserted into the receptacle; and
- a fan holder for mounting the fan to the computer chassis, the fan holder comprising a base attached to the body, and a socket provided on one side of the base and holding the connector therein; and
- retaining means for retaining the fan holder to the computer chassis, wherein when the combined fan and fan holder is detached from the computer chassis, the connector is simultaneously disengaged from the receptacle;
- wherein the socket is integrally formed with the base and defines a groove, and the connector comprises a locating plate received in the groove;
- wherein a pair of latches is provided on the bottom plate, each of the latches defines a locking opening, the fan holder comprises a locking part extending from the base, and the retaining means comprises a fastener formed on the locking part, the fastener being snappingly received in a corresponding locking opening when the fan is retained in the computer chassis;
- wherein the fan holder further comprises an arm extending from the base and opposing the locking part, the arm engaging the body of the fan with a finger sandwiching the body with the base.

* * * * *